(12) United States Patent
Li et al.

(10) Patent No.: US 6,255,169 B1
(45) Date of Patent: Jul. 3, 2001

(54) PROCESS FOR FABRICATING A HIGH-ENDURANCE NON-VOLATILE MEMORY DEVICE

(75) Inventors: Xiao-Yu Li, San Jose; Qi Xiang, Santa Clara; Sunil D. Mehta, San Jose, all of CA (US)

(73) Assignees: Advanced Micro Devices, Inc.; Vantis Corporation, both of Sunnyvale, CA (US)

( * ) Notice: Subject to any disclaimer, the term of this patent is extended or adjusted under 35 U.S.C. 154(b) by 0 days.

(21) Appl. No.: 09/255,053

(22) Filed: Feb. 22, 1999

(51) Int. Cl.[7] ................................................. H01L 21/8247
(52) U.S. Cl. ........................... 438/264; 438/581; 438/258
(58) Field of Search ................................... 438/257–267, 438/766, 981

(56) References Cited

U.S. PATENT DOCUMENTS

| | | | |
|---|---|---|---|
| 5,610,084 | * | 3/1997 | Solo de Zaldivar . |
| 5,908,312 | * | 6/1999 | Cheung et al. ........................ 438/287 |
| 5,942,780 | * | 8/1999 | Barsan et al. ......................... 257/321 |
| 5,960,274 | * | 9/1999 | Mehta ................................... 438/211 |
| 6,017,792 | * | 1/2000 | Sharma et al. ........................ 438/257 |
| 6,069,041 | * | 5/2000 | Tanigami et al. ..................... 438/261 |

* cited by examiner

*Primary Examiner*—Richard Booth
(74) *Attorney, Agent, or Firm*—Brinks Hofer Gilson & Lione

(57) ABSTRACT

A process for fabricating a non-volatile memory device includes the step of forming a nitrogen region in a semiconductor substrate prior to carrying out a thermal oxidation process to form a tunnel oxide layer. In a preferred process, nitrogen atoms are ion implanted into a silicon substrate to form a nitrogen region at the substrate surface. Then, a thermal oxidation process is carried out to grow a thin tunnel oxide layer overlying the surface of the nitrogen region. During the oxidation process, nitrogen is incorporated into the growing tunnel oxide layer. A floating-gate electrode is formed overlying the tunnel oxide layer and receives electrical charge transferred from a charge control region of the substrate through the tunnel oxide layer. The tunnel oxide layer is capable of undergoing repeated programming and erasing operations while exhibiting reduced effects from stress induced current leakage. In another aspect of the invention, an MOS transistor having enhanced carrier mobility is obtained by forming a gate oxide layer over a nitrogen region of a silicon substrate. The thermal oxidation process of the invention also provides both tunnel oxide layers and gate oxide layers having a reduced thickness for a given set of thermal oxidation conditions.

14 Claims, 4 Drawing Sheets

PROCESS FOR FABRICATING A HIGH-ENDURANCE NON-VOLATILE MEMORY DEVICE

FIELD OF THE INVENTION

This invention relates, in general, to non-volatile memory devices and, more particularly, to EEPROM devices and to methods for their fabrication.

BACKGROUND OF THE INVENTION

Non-volatile memory devices are both electrically erasable and programmable. Such devices retain data even after the power to the device is terminated. One particular type of non-volatile memory device is the (electrically-erasable-programmable-read-only-memory) EEPROM device. Non-volatile memory devices, such as the EEPROM, have a limited lifetime due to the endurance related stress such devices suffer each time they go through a program-erase cycle. The endurance of an EEPROM device is defined by the number of program-erase cycles that the device is capable of undergoing without a failure.

In a flash EEPROM device, programming and erasing is accomplished by transferring electrons to and from a floating-gate electrode through a thin dielectric layer, known as a tunnel-oxide layer, located between the floating-gate electrode and the underlying substrate. Typically, the electron transfer is carried out either by hot electron injection, or by Fowler-Nordheim tunneling. In either electron transfer mechanism, a voltage is coupled to the floating-gate electrode by a control-gate electrode. The control-gate electrode is capacitively coupled to the floating-gate electrode, such that a voltage applied to the control-gate electrode is coupled to the floating-gate electrode. In one type of device, the control-gate electrode is a polycrystalline silicon gate electrode overlying the floating-gate electrode, and separated therefrom by a dielectric layer. In another type of device, the floating-gate electrode is a doped region in the semiconductor substrate.

The flash EEPROM device is programmed by applying a high positive voltage to the control-gate electrode, and a lower positive voltage to the drain region of the floating-gate transistor. These applied potentials transfer electrons from the substrate through the tunnel oxide layer and to the floating-gate electrode. Conversely, the EEPROM device is erased by grounding the control-gate electrode, and applying a high positive voltage to either the source or drain region of the floating-gate transistor. Under erase voltage conditions, electrons are removed from the floating-gate electrode and enter either source or drain regions in the semiconductor substrate.

Another type of EEPROM device is extensively used in programmable logic devices (PLDs). EEPROM cells used in PLDs include three transistors: a write transistor, a read transistor, and a sense transistor. In conventional EEPROM cells, the control gates of the write transistor and read transistor are connected to the same wordline. Also, in PLD EEPROM cells, the read transistor and the sense transistor are connected to the same bitline. When the read transistor is turned on, the common bitline connection permits the sense transistor to be effectively used as the storage cell of the EEPROM.

To program PLD EEPROMs, a high voltage (between 13 and 15 volts) is applied to the wordline of the EEPROM cell. A relatively high voltage (approximately 11 to 12 volts) is applied to the control gate of the write transistor, allowing voltage applied on the bitline to be transferred to the control-gate of the sense transistor. The application of such high voltage levels is a write condition that results in data being stored in the EEPROM cell.

To erase the EEPROM cell, a voltage $V_{cc}$ is applied to the wordline of the write transistor, which also causes the read transistor to turn on. Ground potential is applied to the bitline, which is connected to the drain of the read transistor, and a high voltage (between 13 to 15 volts) is applied on the control-gate. Under this bias condition, the high voltage applied to control-gate is coupled to the floating-gate of the sense transistor and the EEPROM cell is erased by the transfer of electrons through the tunnel oxide layer from the floating-gate to the substrate.

As described above, over time EEPROM devices will be written and erased repeatedly as data is stored and removed from the device. Since the EEPROM relies on charge exchange between the substrate and the floating-gate electrode, considerable stress is placed on the tunnel oxide layer underlying the floating-gate electrode. The charge-induced stress in the tunnel oxide layer can cause charge trapping sites to form within the tunnel oxide. The formation of these charge trapping sites is undesirable, because, once formed, electrical current can leak through the tunnel oxide layer from the floating-gate electrode to the substrate. When charge leaks off the floating-gate electrode, a data error occurs in the EEPROM device.

In addition to causing charge to leak from the floating-gate electrode, the accumulation of charge in the trapping sites causes the threshold voltage of the sense transistor to shift away from the originally designed threshold voltage. In an n-channel device, the accumulation of charge in the trapping sites causes the threshold voltage to shift to more negative values. Once the threshold voltage shifts away from the designed value, the sense transistor cannot be turned off by application of a typical read voltage applied to the floating-gate electrode. When this happens, a read error occurs and an incorrect logic signal is transmitted from the EEPROM memory cell.

Both charge leakage and threshold voltage instability produce data errors during operation of the EEPROM device. Depending upon the particular function performed by the EEPROM device, the data error can cause catastrophic failure in an electronic system relying upon the EEPROM device. Accordingly, an improved EEPROM device is necessary to provide a high-endurance EEPROM device that exhibits stable threshold voltage values.

SUMMARY OF THE INVENTION

In practicing the present invention there is provided a process for fabricating a non-volatile memory device in which a tunnel oxide layer is provided that exhibits improved resistance to stress induced current leakage. An improved tunnel oxide layer is obtained by implanting nitrogen atoms into the substrate region upon which the tunnel oxide layer is to be formed. The nitrogen-implanted substrate surface is then subjected to a thermal oxidation process to grow a thin tunnel oxide layer. During the thermal oxidation process, nitrogen is incorporated into the growing oxide layer. The nitrogenated tunnel oxide shows substantially reduced leakage currents as compared with prior art tunnel oxide layers for a given applied gate voltage. Additionally, the nitrogen implant into the substrate surface slows the oxidation rate, such that for a given set of oxidation conditions, a tunnel oxide layer having a reduced thickness is obtained. The fabrication of tunnel oxide layers having reduced thickness and increased resistance to stress induced current leakage is advantageous in the production of non-volatile memory devices. Improved programming and erasing endurance is obtained in non-volatile memory devices, such as PLD EEPROM devices, having very thin tunnel oxide layers.

In one form, a process for fabricating a non-volatile memory device includes providing a semiconductor substrate having a tunnel oxide region, and introducing nitrogen atoms into the tunnel oxide region. A tunnel oxide layer is then formed overlying the tunnel oxide region. The substrate is annealed to form a nitrogenated tunnel oxide layer, and a floating-gate electrode is formed overlying the nitrogenated tunnel oxide layer.

Figure 1:
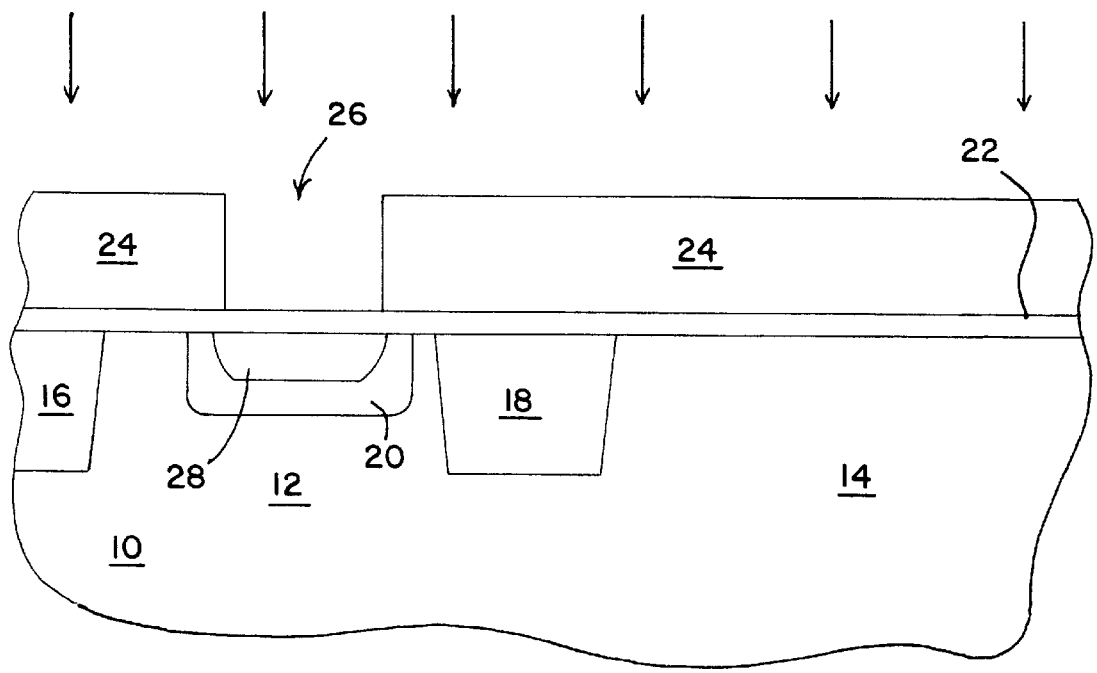
FIGS. 1–4 illustrate, in cross-section, process steps in accordance with a first embodiment of the invention.

For simplicity and clarity of illustration, the elements shown in the Figures have not necessarily been drawn to scale. For example, the dimensions of some of the elements are exaggerated relative to each other. Further, where considered appropriate, reference numerals have been repeated among the Figures to indicate corresponding elements.

DETAILED DESCRIPTION OF PREFERRED EMBODIMENTS

Illustrated in FIG. 1, in cross-section, is a portion of a non-volatile memory device having already undergone several processing steps in accordance with the invention. A semiconductor substrate 10 includes a tunnel oxide region 12 and a transistor region 14. Tunnel oxide region 12 is electrically isolated from transistor region 14 and from additional portions of semiconductor substrate 10 by first and second isolation regions 16 and 18. A control-gate region 20 resides in tunnel oxide region 12 intermediate to first and second isolation regions 16 and 18. Control-gate region 20 is preferably formed by doping semiconductor substrate 10 with a suitable dopant to form a region of high impurity concentration near the surface of semiconductor substrate 10. Preferably, control-gate region 20 is formed by doping semiconductor substrate 10 with an n-type dopant, such as phosphorous, arsenic, antimony, and the like.

For purposes of illustration, the process of the present invention will be described for the fabrication of an n-type EEPROM cell used in a PLD. However, those skilled in the art will appreciate that the advantages of the present invention can be fully realized through the fabrication of a p-type device. In the present embodiment, semiconductor substrate 10 is preferably a p-type single-crystal silicon substrate. Preferably, control-gate region 20 is fabricated by the implantation of phosphorous to a dose of preferably about 1.0E13 to 2.0E15 ions/cm$^2$, and more preferably about 5E14 to 1.5E15 ions/cm$^2$, and at an implantation energy of about 40 to 80 KeV. Once phosphorous is introduced into semiconductor substrate 10, the substrate is annealed to activate the dopant. The phosphorous ion implantation and annealing process forms a p-n junction in semiconductor substrate 10 at a depth of about 0.4 to about 0.6 microns from the substrate surface.

The ion implantation process is preferably performed through a sacrificial oxide layer 22 overlying the surface of semiconductor substrate 10. Preferably, sacrificial oxide layer 22 is a thermally grown silicon oxide layer having a thickness of preferably about 100 to 200 Å, and more preferably about 150 Å.

Following the formation of charge control region 20, a lithographic mask 24 is formed to overly sacrificial oxide layer 22. Lithographic mask 24 has an opening 26 exposing a portion of sacrificial oxide layer 22 overlying charge control region 20.

In accordance with the invention, nitrogen atoms are introduced into semiconductor substrate 10 to form a nitrogen region 28 in semiconductor substrate 10. For purposes of illustration, nitrogen region 28 is depicted as residing wholly within control-gate region 20. However, it is within the scope of the present invention to form a wide variety of nitrogen regions, similar to nitrogen region 28, within semiconductor substrate 10. As described below, the benefits of forming a nitrogen region in a semiconductor substrate can be realized in a variety of device components. Accordingly, nitrogen regions, such as nitrogen region 28, can be formed at various locations within semiconductor substrate 10 for the subsequent fabrication of various device components.

In a preferred embodiment, nitrogen region 28 is formed by the ion implantation of elemental nitrogen atoms into semiconductor substrate 10. In one embodiment of the invention, the nitrogen implant is carried out with an ion implantation energy of preferably about 10 to 15 KeV, and more preferably about 30 KeV. The implant process forms a nitrogen junction at a depth, that in general, is less than the junction depth of control-gate region 20, but can be about 0.5 microns or less. Sacrificial oxide layer 22 prevents damage to the surface of semiconductor substrate 10 during the ion implantation processes used to form both control-gate region 20 and nitrogen region 28. After nitrogen implantation, semiconductor substrate 10 is annealed to remove damage caused by the implanted nitrogen in the silicon lattice structure of semiconductor substrate 10. In one embodiment, the annealing step is carried out in a rapid thermal annealing apparatus. Alternatively, the annealing process can be performed by subsequent oxidation of semiconductor substrate 10. Preferably, the annealing process is carried out in a rapid thermal annealing apparatus at a temperature of about 975° C. The resulting nitrogen concentration in control-gate region 20 is preferably about 1.0E17 to 1.0E21 atoms/cm$^3$.

Figure 2:
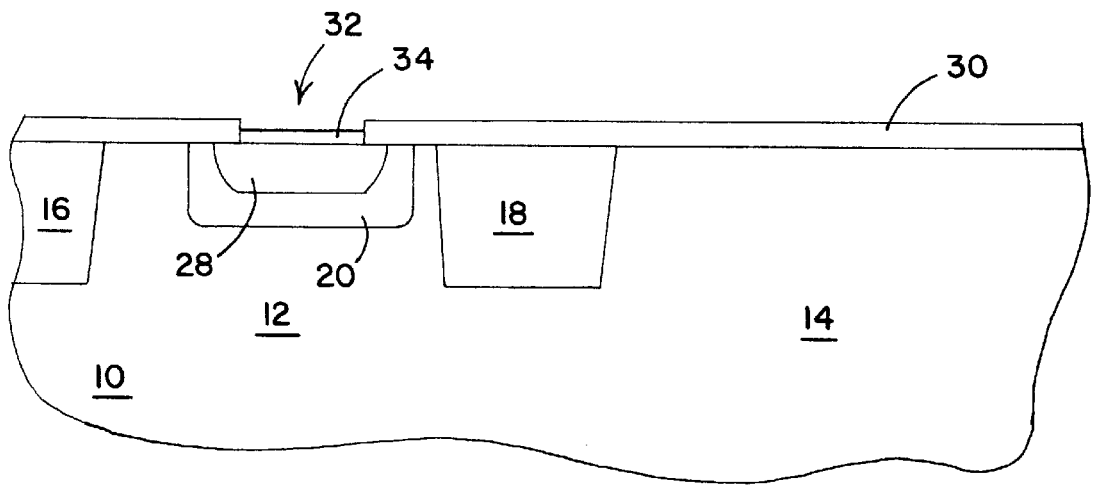

After forming nitrogen region 28, lithographic mask 24 and sacrificial oxide layer 22 are removed, and a gate oxide layer 30 is formed on the surface of semiconductor substrate 10, as illustrated in FIG. 2. Preferably, gate oxide layer 30 is a thermally grown silicon oxide layer having a thickness of preferably about 60 to 100 Å, and more preferably about 80 Å.

Once gate oxide layer 30 is formed, a lithographic mask is formed on the surface of gate oxide layer 30, and etching process is carried out to form an opening 32 in gate oxide layer 30 over nitrogen region 28. Preferably, opening 32 is formed by a selective ion etching process, in which the dielectric material of gate oxide layer 30 is etched much more rapidly than the silicon of semiconductor substrate 10. In one embodiment, a fluorinated gas plasma is used to reactively ion etch gate oxide layer 30.

After forming opening 32 in gate oxide layer 30, a thermal oxidation process is carried out to form a tunnel oxide layer 34 overlying nitrogen region 28. The oxidation process is preferably a thermal oxidation carried out at a temperature of about 800 to 1000° C., and more preferably at about 900° C.

The thermal oxidation process is preferably carried out for about 80 to 120 minutes, and more preferably about 100 minutes to grow tunnel oxide layer to a thickness of about 80 Å. Those skilled in the art will appreciate that the formation of a thermal oxide layer over a nitrogen region can result in retarding the growth rate of silicon dioxide formed over a nitrogenated silicon substrate. A description of the effects on the silicon dioxide growth rate of a nitrogen implant in a silicon substrate is described in U.S. Pat. No. 5,672,521 to Barsan, et al., issued Sep. 30, 1997, and such disclosure is incorporated by reference herein.

Figure 3:
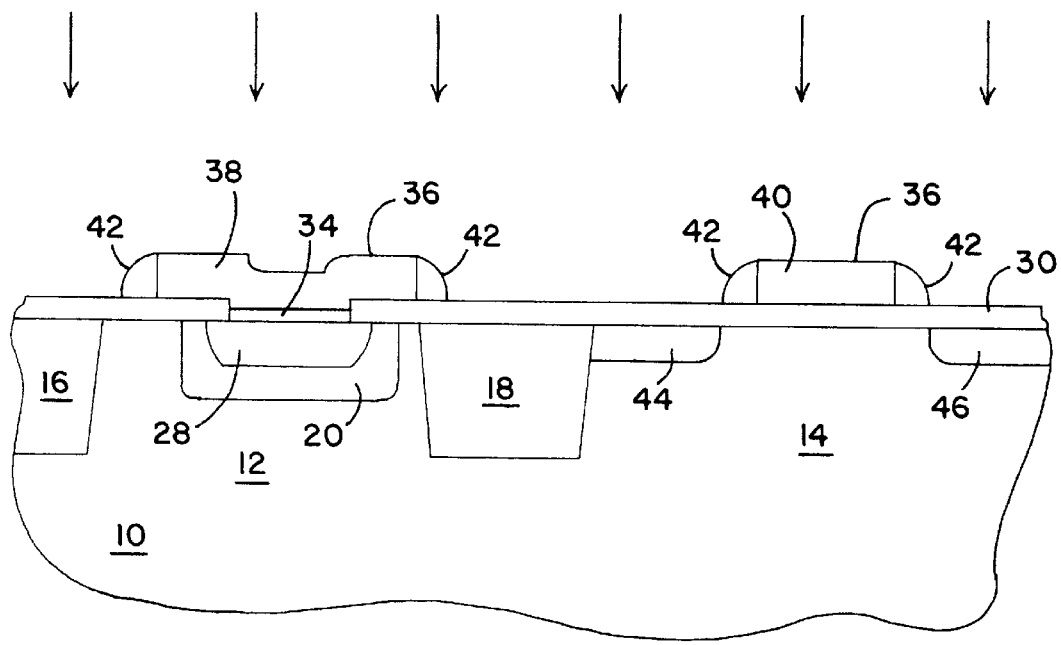

The process of the invention continues with the formation of a floating-gate electrode 36, as illustrated in FIG. 3. Floating-gate electrode 36 includes a first portion 38 overlying tunnel oxide layer 34, and a second portion 40 overlying gate oxide layer 30 in transistor region 14. Preferably, floating-gate electrode 36 is formed by the chemical vapor deposition of polycrystalline silicon to a thickness of preferably about 2000 to 4000 Å, and more preferably to about 3000 Å. Once deposited, the polycrystalline silicon is lithographically patterned and a reactive ion etching process is carried out to form various polycrystalline silicon structures on the surface of semiconductor substrate 10. In addition to floating-gate electrode 36, the etching process also forms gate electrodes for additional transistors commonly used in EEPROM cells within PLDs, such as read transistor gate electrodes, write transistor gate electrodes, high-voltage power supply gate electrodes, and the like (not shown).

In one embodiment of the invention, after forming floating-gate electrode 36, sidewall spacers 42 are formed on the vertical edges of floating-gate electrode 36. Then, an ion implantation process is carried out to form a source region 44 and a drain region 46 in transistor region 14. Source and drain regions 44 and 46 are aligned in space relationship with sidewall spacers 42 on second portion 40 of floating-gate electrode 36. Preferably, sidewall spacers 42 are formed by the deposition and anisotropic etching of a spacer forming material that is differentially etchable with respect to dioxide layer 30. Alternatively, sidewall spacers 42 can be formed by a material that is not differentially etchable with respect to gate oxide layer 30, in which case exposed portions of gate oxide layer 30 are also removed by the etching process used to form sidewall spacers 42. In this case, a subsequent oxide layer is regrown on the surface of semiconductor substrate 10 prior to the ion implantation process used to form source and drain regions 44 and 46.

Figure 4:
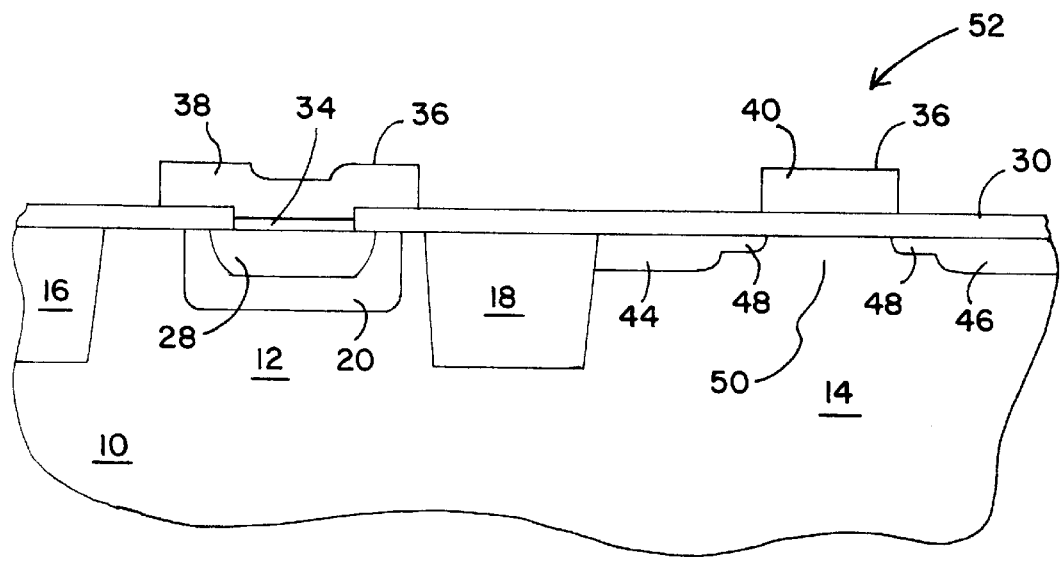

Following the formation of source and drain regions 44 and 46, sidewall spacers 42 are removed, as illustrated in FIG. 4. Then, an ion implantation process is carried out to form source/drain extension regions 48 in transistor region 14. Source/drain extension regions 48 are aligned in space relationship to the edges of second portion 40 of floating-gate electrode 36. Source/drain extension regions 48 are separated by a channel region 50 therebetween. Second portion 40 of floating-gate electrode 36, source and drain regions 44 and 46, source/drain extension regions 48 and channel region 50 form the operative elements of a sense transistor 52. The source/drain extension regions are needed to combat short channel effects in sense transistor 52 as described above. It is essential that sense transistor 52 have a stable threshold voltage. Those skilled in the art will appreciate that short channel effects can alter the threshold voltage in transistors having effective channel lengths below about 1 micron.

In operation, the device illustrated in FIG. 4 is programmed by inducing the flow of charge from charge control region 20 across tunnel oxide layer 34 and into floating-gate electrode 36. The presence of a charge is detected by the threshold voltage of sense transistor 52. The threshold voltage of sense transistor 52 increases when charge is placed on floating-gate electrode 36. Correspondingly, the device illustrated in FIG. 4 is erased by inducing the flow of charge out of floating-gate electrode 36. The erased condition is detected by the reduction of the threshold voltage of sense transistor 52.

As described above, over a period of time a large number of programming and erase cycles are typically carried out in operation of an EEPROM cell. Also, over time charge trapping cites can form in the tunnel oxide layer causing current leakage from floating-gate electrode 36 and into semiconductor substrate 10. By forming nitrogen region 28 prior to forming tunnel oxide layer 34, tunnel oxide layer 34 exhibits reduced leakage with repeated programming and erasing cycles. It has been surprisingly found that by growing a tunnel oxide layer, such as tunnel oxide layer 34, over a nitrogen region, such as nitrogen region 28, that a reduction in stress-induced-leakage current (SILC) is obtained.

Figure 5:
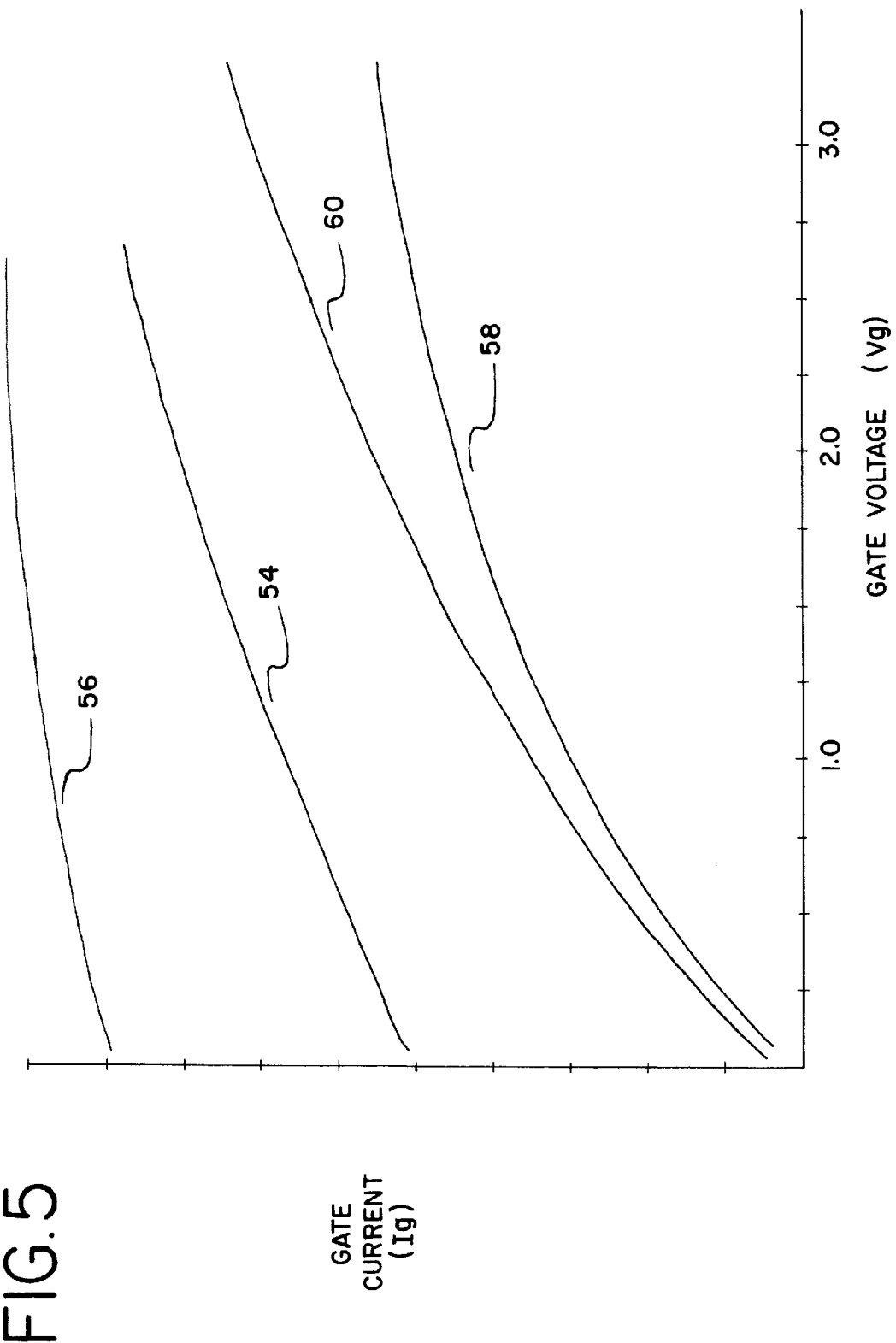
FIG. 5 is a comparison plot of gate current versus gate voltage before and after numerous program-erase cycles for devices fabricated in accordance with the invention and for devices fabricated in accordance with the prior art.

The plot shown in FIG. 5 illustrates the improved SILC performance of an EEPROM device having a tunnel oxide layer fabricated in accordance with the invention. The SILC performance of a tunnel oxide layer can be determined by fabricating a series of capacitors and measuring the gate current as a function of the gate voltage both before and after stressing the capacitors. The capacitors are stressed by performing multiple programming and erasing cycles. As the tunnel oxide begins to leak electrical charge as a result of stress cycling, the gate current in the capacitor will increase at a given applied gate voltage. Curves 54 and 56 represent the current voltage characteristics for capacitors having tunnel oxide layers fabricated in accordance with the prior art. Correspondingly, curves 58 and 60 represent the current-voltage characteristics for capacitors fabricated in accordance with the invention.

As indicated in FIG. 5, after repeated stressing, the prior art tunnel oxide layer shows the effects of SILC and exhibits an increase in gate current for a given applied gate voltage. In contrast, capacitors having a tunnel oxide layer fabricated in accordance with the invention exhibit dramatically reduced SILC when subjected to the same stress conditions. Curve 58 shows the current voltage characteristics of a test capacitor having a tunnel oxide layer fabricated in accordance with the invention before stressing. Curve 60 illustrates the current voltage characteristics of the test capacitors after applying stressing conditions. As indicated by curves 58 and 60, less gate current is measured at a given applied gate voltage both before and after stressing of tunnel oxide fabricated in accordance with the invention, as compared with tunnel oxide layers fabricated in accordance with the prior art.

In addition to having beneficial effects on tunnel oxide layers used in EEPROM cells, the process of the present invention is also beneficial for the fabrication of gate oxide layers for metal-oxide-semiconductor (MOS) transistors. In MOS transistors used in semiconductor devices, including non-volatile semiconductor devices, the carrier mobility can directly affect the switching speed of the transistor. It has been surprisingly found that the formation of a gate oxide layer over a nitrogen implanted region can increase the mobility of an MOS transistor. Accordingly, it is within the scope of the present invention that MOS transistors be formed having a gate oxide layer thermally grown over a nitrogen region in a silicon substrate.

Figure 6:
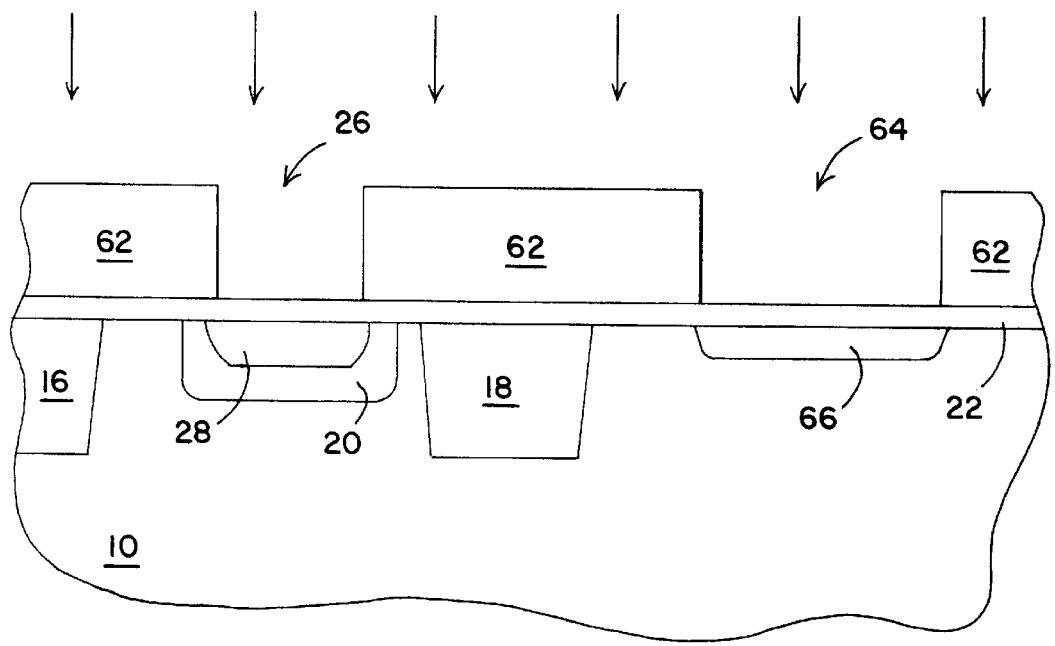
FIGS. 6–7 illustrate, in cross-section, process steps in accordance with another embodiment of the invention.
Figure 7:
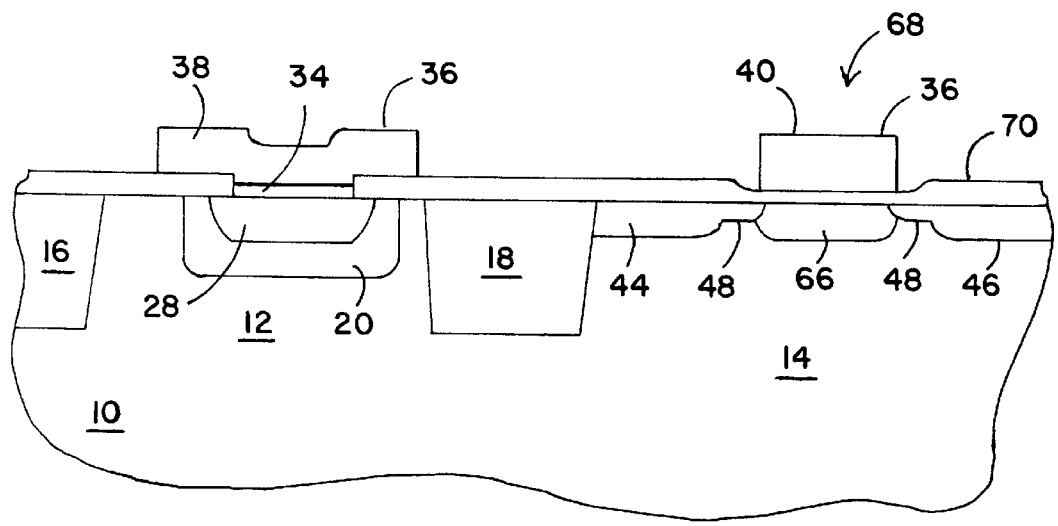

FIGS. 6–7 illustrate, in cross-section, processing steps in accordance with another embodiment of the invention. To fabricate MOS transistors having a gate oxide layer grown over a nitrogen region, a lithographic mask 62 is formed over sacrificial oxide layer 22. Lithographic mask 62 has a first opening 26 and a second opening 64. In accordance with the preferred embodiment, nitrogen atoms are implanted through sacrificial oxide layer 22 to form nitrogen region 28 and nitrogen region 66 in substrate 10. Although nitrogen region 66 is illustrated as being formed simultaneously with nitrogen region 28, other processing methods are possible. For example, various nitrogen regions can be formed at different times during a device fabrication process using masking layers other than the masking layer used to form nitrogen region 28. Additionally, the ion implantation and annealing processes described above can be used or, alternatively, a different nitrogen ion implantation dose and energy can be used for the subsequent formation of gate oxide layers for MOS transistors. Accordingly, all such variations and modifications are within the scope of the present invention.

Once nitrogen regions 28 and 66 have been formed, floating-gate electrode 36 and source and drain regions 44 and 46, and source/drain extension regions 48 are fabricated as described above. Upon completion of the fabrication sequence, a sense transistor 68 is formed having a nitrogen region 66 and a gate-oxide layer 70. Because of the oxidation retarding effect of nitrogen region 70, the thickness of gate oxide layer 70 is reduced over nitrogen region 66.

By fabricating sense transistor 68 with a gate oxide layer grown over a nitrogen region, the mobility of sense transistor 68 is substantially improved. Accordingly, the performance of an EEPROM device including sense transistor 68 is also improved. During operation, the increased mobility of sense transistor 68 permits faster and more reliable detection of the threshold voltage of sense transistor 68. Those skilled in the art will appreciate that other transistors commonly used in an EEPROM device, such as read transistors, write transistors, and the like, can be fabricated using the same fabrication sequence described with respect to the formation of sense transistor 68. Accordingly, all such variations and modifications are within the scope of the present invention.

In addition to the improved SILC and mobility characteristics of transistors fabricated in accordance with the invention, the formation of tunnel oxide layers and gate oxide layers over a nitrogen region also enables the fabrication of oxide layers having a reduced thickness. This is an important aspect of the invention that can be applied to scaling the dimensions of all of the transistors in a non-volatile memory device. By obtaining oxide layers capable of high endurance, yet having a reduced thickness, higher packing densities can be achieved in a non-volatile memory device. Those skilled in the art will recognize that the thickness of gate oxide layers and tunnel oxide layers is a major consideration in scaling transistor components to smaller geometric dimensions. The process of the present invention overcomes one particular problem associated with fabricating thin tunnel oxide layers: the increase in SILC as the tunnel oxide thickness is reduced. The process of the present invention overcomes this problem by providing a tunnel oxide layer having a reduced thickness, yet exhibiting reduced SILC. Accordingly, the process of the present invention enables non-volatile memory devices to be fabricated with higher packing densities.

Thus it is apparent that there has been provided, in accordance with the invention, a process for fabricating a non-volatile memory device that fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, refractory-metal silicide layers can be included in the source and drain regions and in the transistor gate electrodes, and the like. Additionally, various processing technology can be used, such as magnetically enhanced etching techniques, deep UV photolithography, X-ray lithography, and the like, can be used. It is therefore intended to include within the invention all such variations and modifications as filed within the scope of the appended claims and equivalents thereof.

What is claimed is:

1. A process of fabricating a non-volatile memory device having reduced stress-induced-leakage-current comprising the steps of:

providing a semiconductor substrate having a tunnel oxide region and a sense transistor region;

forming a sacrificial oxide layer to overlie the tunnel oxide region and the sense transistor region;

forming a masking pattern overlying the sacrificial oxide layer, wherein the masking pattern exposes a portion of the sacrificial oxide layer overlying the tunnel oxide region and a portion of the sacrificial oxide layer overlying the sense transistor region;

introducing nitrogen atoms into the tunnel oxide region and the sense transistor region of the substrate;

removing the masking pattern and the sacrificial oxide layer;

forming a tunnel oxide layer overlying the tunnel oxide region and a gate oxide layer overlying the sense transistor region, wherein the tunnel oxide layer has a first thickness and the gate oxide has a second thickness, and wherein the first thickness is no greater than the second thickness; and forming a first portion of a floating-gate electrode on the tunnel oxide layer and a second portion of the floating-gate electrode on the gate oxide layer.

2. The process of claim 1, wherein the step of introducing nitrogen atoms comprises ion implantation of elemental nitrogen.

3. The process of claim 2, wherein the step of introducing nitrogen atoms comprises ion implanting nitrogen atoms to a dose of about 1.0E13 to 1.0E15 ions/cm$^2$.

4. The process of claim 1, further comprising the step of annealing the substrate by rapid thermal annealing at a temperature of about 975° C.

5. The process of claim 1, wherein the step of forming a tunnel oxide layer overlying the tunnel oxide region and a gate oxide layer overlying the transistor region comprises thermal oxidation of silicon, wherein nitrogen is incorporated into the tunnel oxide layer and into the gate oxide layer.

6. A process for fabricating a non-volatile memory cell in a programmable logic device having reduced stress-induced-leakage-current comprising the steps of:

providing a semiconductor substrate having a tunnel oxide region and a sense transistor region;

forming a control-gate region in the tunnel oxide region;

introducing elemental nitrogen atoms into the control-gate region to form a nitrogen region therein;

forming a tunnel oxide layer overlying the control-gate region, wherein the tunnel oxide layer has a first thickness;

forming a gate oxide layer overlying the sense transistor region, wherein the gate oxide has a second thickness, and wherein the first thickness is no greater than the second thickness; and forming a floating-gate electrode overlying the tunnel oxide layer and a portion of the gate oxide layer.

7. The process of claim 6, wherein the step of forming a control-gate region comprises forming an n-type region in the semiconductor substrate having a junction depth of about 0.4 to 0.6 microns, and wherein the nitrogen region has a junction depth of no greater than about 0.5 microns.

8. The process of claim 7, further comprising the steps of:

forming a nitrogen region in the transistor region; and forming a sense transistor gate electrode overlying a portion of the gate oxide layer in spaced relationship to the nitrogen region.

9. The process of claim 8, further comprising forming source and drain regions in the transistor region in spaced relationship to the sense transistor gate electrode, wherein the source and drain regions are spaced apart by a channel region and wherein the channel region resides in the nitrogen region located in the transistor region.

10. The process of claim 6, wherein the step of introducing elemental nitrogen atoms comprises ion implantation of elemental nitrogen.

11. The process of claim 10, wherein the step of introducing nitrogen atoms comprises ion implanting nitrogen atoms to a dose of about 1.0E13 to 1.0E15 ions/cm$^2$.

12. The process of claim 6 further comprising the step of annealing the substrate after introducing elemental nitrogen by means of rapid thermal annealing at a temperature of about 975° C.

13. The process of claim 6, wherein the step of forming a tunnel oxide layer overlying the tunnel oxide region and a gate oxide layer overlying the transistor region comprises thermal oxidation of silicon, wherein nitrogen is incorporated into the tunnel oxide layer and into the gate oxide layer.

14. The process of claim 6, wherein the step of introducing nitrogen atoms comprises forming a nitrogen concentration of about 1.0E17 to 1.0E21 atoms/cm$^3$.

\* \* \* \* \*